United States Patent [19]

Grimm et al.

[11] 3,784,954

[45] Jan. 8, 1974

[54] APPARATUS FOR PLUG CONNECTION OF PRINTED CIRCUIT BOARDS

[75] Inventors: Hans-Ueli Grimm, Ebikon; Daniel Zufferey, Luzern; Antonio Messina, Emmenbrucke, all of Switzerland

[73] Assignee: Inventio Aktiengesellschaft, Hergiswil, Switzerland

[22] Filed: Apr. 28, 1972

[21] Appl. No.: 248,395

[30] Foreign Application Priority Data

May 6, 1971 Switzerland ........................ 6734/71

[52] U.S. Cl. .......... 339/17 LM, 317/101, 339/45 M

[51] Int. Cl. ............................................ H01r 13/54

[58] Field of Search ................... 339/17, 18, 45, 75, 339/91; 317/101 DH; 211/41; 312/319, 320; 248/147

[56] References Cited

UNITED STATES PATENTS

| | | | |
|---|---|---|---|
| 2,647,244 | 7/1953 | Dewey et al. | 339/45 M |
| 2,944,864 | 7/1960 | Krivulka | 339/75 M |
| 2,993,187 | 7/1961 | Bisbing et al. | 39/17 LM |

FOREIGN PATENTS OR APPLICATIONS

| | | | |
|---|---|---|---|
| 1,262,383 | 7/1968 | Germany | 317/101 DH |

OTHER PUBLICATIONS

IBM Technical Disclosure Bulletin, Vol. 10, No. 11, 1968–04, "Latch," M. E. Ecker et al.

*Primary Examiner*—Bobby R. Gay
*Assistant Examiner*—Terrell P. Lewis
*Attorney*—Werner W. Kleeman

[57] ABSTRACT

An apparatus for establishing a plug connection at printed circuit boards wherein the circuit boards can be plug connected with a contact element secured to a support, the circuit boards sliding in guides secured to the support at their edges which are in parallelism with the direction of insertion of the circuit boards. According to the invention a respective double-arm lever having an actuation arm and an engagement arm is rotatably mounted in mirror-image fashion at the narrow sides of the fixed contact element. The engagement arm possesses a slot at its end removed from the axis of rotation for receiving a bolt secured to the circuit board and by means of the actuation arm the circuit board through the agency of the engagement arm and the bolt can be selectively inserted into and removed from the fixed contact element.

10 Claims, 3 Drawing Figures

APPARATUS FOR PLUG CONNECTION OF PRINTED CIRCUIT BOARDS

BACKGROUND OF THE INVENTION

The present invention relates to an improved apparatus for the plug connection of printed circuit boards wherein the circuit boards can be plug connected with a contact element secured to a support.

The plug connection or insertion of printed circuit boards at the connectors or contact rails secured for instance to the housing of an apparatus or a base plate generally proceeds in the manner that the circuit board is positioned with its end face, at which the connection points or terminals of the components secured to the circuit board protrude in a comb-like fashion, at the connector equipped with contact blades or springs. Then by application of pressure from the hand the circuit board is plug connected with the connector or contact rail. For the purpose of introducing the circuit board at the connector generally means are provided which serve to guide the circuit board at the edges which are parallel to the direction of introduction of the circuit board to the connector. Even for smaller circuit boards having only few contacts it is necessary to exert a relatively large manual pressure during the insertion operation, which, in turn, can result in bending of the circuit board and under certain circumstances could lead to destruction of solder locations and even certain of the electrical components. With larger circuit boards and a greater number of contacts it is necessary to provide special measures to avoid the exertion of considerable manual pressure upon the circuit board.

One of the expedients suitable for this purpose and which has become known in the art contemplates displacing the circuit board carrying the plug connection component between the contact springs of a connector secured to the housing of the apparatus and without contacting such contact springs. Following such insertion the contact springs are pressed against the corresponding counter-contacts of the circuit board through the agency of a manually operated press-on mechanism. An improved prior art construction resorts to the use of the insertion movement for actually actuating the contact press-on mechanism. In this case the circuit board is resiliently mounted with the plug component in a bracket. Following insertion of the circuit board bolt members located at the bracket, during further displacement of the bracket, engage with a bifurcated lever and thus actuate the contact press-on mechanism. For most applications this type construction is much too complicated and expensive. Instead of using economical commercially available connectors or contact rails it is necessary to use expensive special constructions. The mechanics of the contact press-on mechanism as well as the resilient mounting of the circuit board in a special bracket requires an expenditure which, in many instances, cannot be economically justified. With circuit boards possessing a large number of contacts it is quite possible under certain circumstances even when manually removing the circuit board from the connector that considerable forces must by employed which, if the point of application of such force is unfavorable, for instance can also lead to destruction of the solder locations of the electrical components. Now in order to avoid this drawback, there has already been proposed an apparatus which consists of a double-arm lever rotatably mounted at the circuit board at the side opposite the plug component. The longer lever arm serving as a hand-grip, upon actuating the shorter lever arm, pushes against a stop at the apparatus housing so that the circuit board can be removed. With this construction manual insertion of the circuit board is required.

SUMMARY OF THE INVENTION

Hence, from what has been explained above it should be recognized that this particular field of technology is still in need of an improved construction of apparatus for establishing a plug connection at circuit boards in a manner not associated with the aforementioned drawbacks and limitations of the state-of-the-art proposals. Accordingly, it is a primary object of the present invention to provide such improved apparatus which effectively and reliably fulfills the existing need in the art and is not associated with the aforementioned drawbacks and limitations of the prior art constructions.

Another and more specific object of the present invention relates to a relatively simple, economical to manufacture apparatus for the plug connection of printed circuit boards which permits inserting and withdrawing the circuit boards without bending the circuit boards due to manual exerted pressure and possible damage to solder locations and electrical components thereof.

Yet a further significant object of the present invention relates to a new and improved construction of apparatus for reliably, accurately and safely mounting circuit boards for establishing a plug connection without the need to apply appreciable forces to the circuit board which could damage same or components thereof.

A further significant object of the present invention relates to a novel construction of apparatus for safely, quickly and reliably establishing a plug connection at printed circuit boards employing means for applying the circuit board into a position establishing the requisite electrical contact without the need to exert manual pressure and while safeguarding against possibly overloading the circuit board and the components carried thereby as well as the solder locations appearing thereat.

Now in order to implement these and still further objects of the invention, which will become more readily apparent as the description proceeds, the invention contemplates the provision of a respective double-arm lever having an actuation arm and an engagement arm rotatably mounted in mirror-image arrangement at both narrow sides of a fixed contact element. The engagement arm possesses a slot at the end removed from the axis of rotation of the associated double-arm lever, this slot serving to receive a bolt secured to the circuit board. By means of the actuation arm the circuit board can be selectively inserted at or withdrawn from the fixed contact element through the agency of the engagement arm and the bolt.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE PREFERRED EMBODIMENTS

Figure 1:
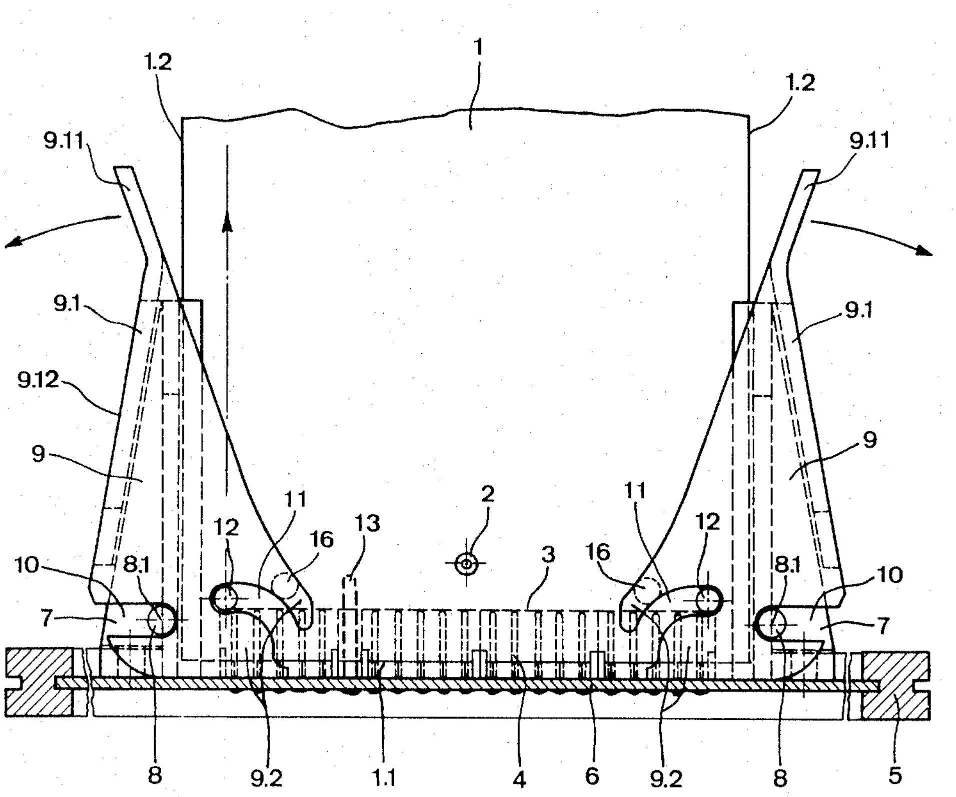
FIG. 1 is a side view of a preferred constructional form of inventive apparatus for establishing a plug connection at circuit boards.

Considering now the drawings, there is depicted therein an exemplary embodiment of apparatus for establishing a plug-type connection at printed circuit boards. Accordingly, in FIG. 1 to 3 reference numeral 1 designates two circuit boards assembled together into a unit by means of the spacer bolt 2 or equivalent means. These circuit boards are equipped with any suitable and therefore not particularly illustrated electrical components and each further possess at their forward or leading edge 1.1 a contact rail or connectors 3. In the inserted condition the contacts of the connectors 3 are connected with contact pins 4 of a circuit board 6 defining a contact element and secured to the apparatus housing or frame 5 in a direction which is transverse to the direction of extent of the circuit boards 1. The fixed circuit board 6, which likewise can be provided with electrical components, provides the electrical connection to further circuit boards arranged parallel to the circuit boards 1 and to electrical components connected to the apparatus housing 5.

Figure 2:
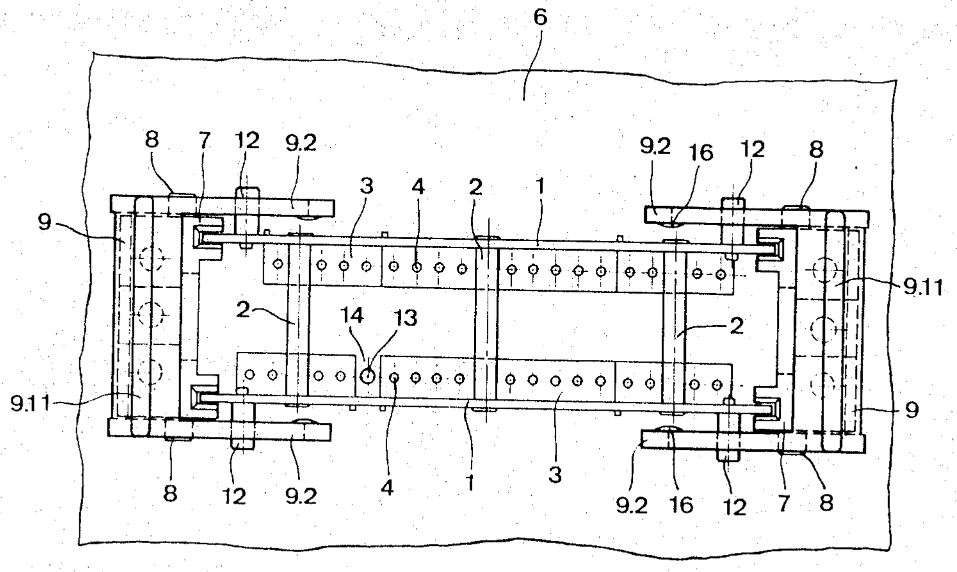
FIG. 2 depicts the apparatus of FIG. 1 viewed in the direction of insertion or assembly of the circuit boards.

The circuit boards 1 slide in guides 7 by means of their edges 1.2 which extend essentially parallel to the direction of insertion or assembly of such circuit boards. The guides or guide means 7 may be connected to the circuit board 6 or, however, can be also mounted at the apparatus housing 5. Double-arm levers 9 are rotatably mounted upon journals or pivot pins 8 which are fixedly connected with the guides 7. For the purpose of simplifying the assembly of the apparatus the support or bearing bore of each lever 9 is constructed as a slot 10 open at one side. In order to be able to insert both circuit the 1 with the same force the double-arm levers 9 are advantageously constructed as a double lever arrangement and therefore possess a substantially U-shaped cross-sectional configuration. The web 9.12 interconnecting th legs of the U-shaped double lever arrangement, which legs are formed by the mirror-image arranged levers 9, bears against the associated guide 7 when the apparatus assumes its closed or effectual position as depicted in FIG. 1.

An actuation arm 9.1 of each double-arm lever 9 is provided at its upper end with a flexed portion or projection 9.11 which is suitable for manual actuation. An engagement arm 9.2 of each double-arm lever 9 is provided at its end remote from the axis of rotation with a slot 11 open at one side and approximating the shape of a circular involute, the base circle-center point of which coincides with the axis of rotation 8.1 of the lever 9. In order to be able to obtain favorable force conditions, i.e., mechanical advantage during actuation of the apparatus, actuation arm 9.1 is designed to be longer than the engagement arm 9.2. During rotation of the lever 9 in a direction corresponding to insertion of the circuit boards 1 the slots 11 each engage with a bolt member 12 secured to the circuit boards 1, due to which insertion of the circuit boards 1 takes place and the electrical connection is established between the connectors 3 and the contact pins 4 secured in an insulated manner to the apparatus housing 5. As shown in the drawing, one such bolt member 12 is arranged at each end of each circuit board 1 for engagement with the slot 11 of each associated double-arm lever 9. A pin 13 secured to the circuit board 6 extends into a bore or gap 14 provided at connector or contact rail 3. As a result, there is ensured that the circuit board 1 can be only introduced in a certain predetermined position.

Figure 3:
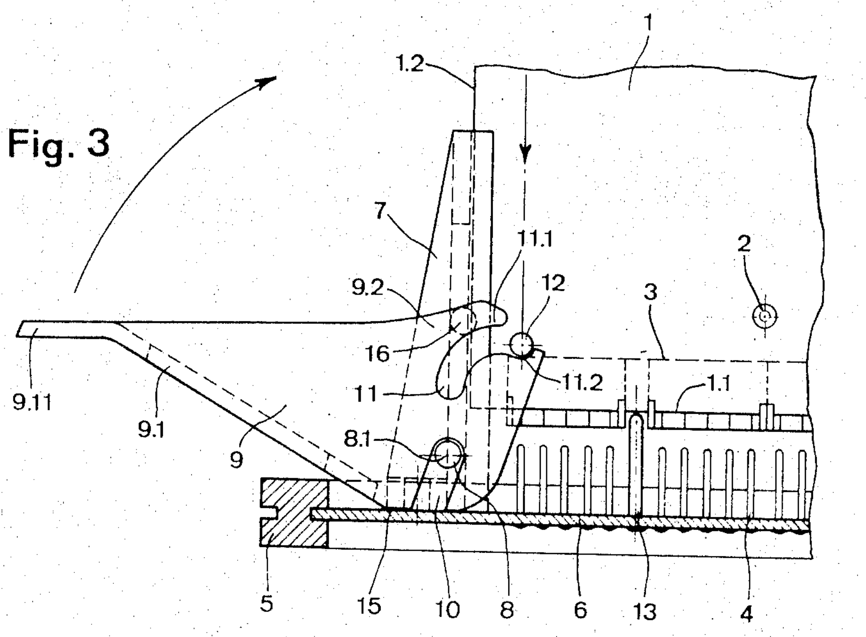
FIG. 3 is a fragmentary view of the apparatus depicted in FIG. 1 showing same in its open or ineffective position prior to establishing the plug connection.

As best seen by referring to FIG. 3 during rotation of the lever 9 until reaching a stop or impact 15 a lens-shaped enlarged portion 16 arrives at the region of a narrow gap between the engagement arm 9.2 and the guide 7. Hence, there is brought about a clamping action and lever 9 is fixed in this position. During initial manual insertion of the circuit board 1 each bolt 12 slides past the outer edge 11.1 of the associated slot 11 and impacts against an extension of the inner edge 11.2 before there is established the contact connection between the connector 3 and the contact pins 4. Hence, force conditions prevail between the bolts 12 and the lever 9 which make it impossible to further manually insert the circuit board 1, so that the last portion of the assembly or insertion movement can only be carried out with the aid of the lever 9.

The advantages which can be realized with the practice of the teachings of this development reside in the fact that circuit boards, especially those having a large number of contact locations and therefore requiring large insertion- and withdrawal forces, can be inserted and retracted with a relatively simple and economical to manufacture apparatus without requiring large application of force. A further advantage realized by the invention manifests itself through the particular construction of the apparatus, preventing manual insertion of the circuit boards with exertion of large forces which might damage the circuit boards as previously discussed.

It is, of course, within the contemplation of this invention to design the apparatus such that only one circuit board can be inserted and removed, or however also by duplicating and combining together the levers a number of circuit boards connected together into an insertable unit can be simultaneously inserted and retracted, providing still a further advantage of the invention. In contrast to the illustrated exemplary embodiment it can be also advantageous to arrange the connector or contact rail at the apparatus housing and the contact pins at the circuit board to be inserted.

While there is shown and described present preferred embodiments of the invention, it is to be distinctly understood that the invention is not limited thereto but may be otherwise variously embodied and practiced within the scope of the following claims. ACCORDINGLY,

What is claimed is:

1. An apparatus for establishing a plug-type connection for printed circuit boards comprising a contact element fixedly secured to a frame, at least one circuit board connectable with said contact element, guide means provided at said frame for slidably guiding said circuit board at its edge extending substantially parallel to the direction of insertion, said contact element having opposite side faces, a number of respective double-arm levers each incorporating an actuation arm and an engagement arm, means for rotatably mounting each of said double-arm levers at the region of one of the side faces of the contact element in a mirror-image arrangement, said circuit board having secured thereto a respective bolt member for each double-arm lever, the engagement arm of each double-arm lever having a slot at the end thereof removed from its axis of rotation for receiving said bolt member, and by means of the actuation arm of said double-arm lever the circuit board can be sleectively inserted at or withdrawn from the contact element through the agency of the engagement arm and the bolt member, and further including a substantially lens-shaped enlarged portion arranged at the engagement arm at the side confronting the associated guide means, impact means for bearing against each double-arm lever when said lever is rotated into a position for contact therewith, said lens-shaped enlarged portion, upon rotation of said lever into contact with said impact means, providing a clamping action at a narrow gap formed between the engagement arm and the guide means so that the double-arm lever is retained in such position.

2. The apparatus as defined in claim 1, wherein the slot located at the engagement arm of the double-arm lever possesses a form approximating a circular involute, the base circle-center point of which substantially coincides with the axis of rotation of the double-arm lever.

3. The apparatus as defined in claim 1, wherein the slot located at the engagement arm of the double-arm lever possesses the shape of a circular arc.

4. The apparatus as defined in claim 1, wherein the engagement arm of the double-arm lever is constructed such that an inner edge of the slot is longer than an outer edge thereof so that when the apparatus is open, during manual insertion of the circuit board, the bolt member secured to the circuit board slides past the outer edge of the slot but bears against an extension of said inner edge.

5. The apparatus as defined in claim 1, wherein said actuation arm is longer than said engagement arm.

6. The apparatus as defined in claim 1, wherein said actuation arm possesses a flexed portion suitable for manual actuation.

7. The apparatus as defined in claim 1, wherein the mounting means for each said double-arm lever comprises journal pin means arranged at the guide means.

8. The apparatus as defined in claim 1, further including a multiplicity of said levers and guide means for the simultaneous insertion and retraction of a plurality of circuit boards connected together into an insertable unit.

9. The apparatus as defined in claim 1, wherein said double-arm lever is constructed as a double lever arrangement having a substantially U-shaped cross-sectional configuration for the insertion of two circuit boards, said double lever arrangement including a web interconnecting leg portions of the U-shaped double lever arrangement and said web bearing against the associated guide means when the apparatus is in a closed position with the circuit boards inserted.

10. The apparatus as defined in claim 1, wherein the double-arm lever has an axis of rotation which extends substantially perpendicular to the circuit board.

* * * * *